US011124744B2

(12) United States Patent
Shellef et al.

(10) Patent No.: US 11,124,744 B2
(45) Date of Patent: Sep. 21, 2021

(54) COMPOSITIONS CONTAINING TRANS-1,2-DICHLOROETHYLENE AND A HYDROFLUOROETHER, AND METHODS OF USING THE SAME

(71) Applicant: SHELLEF HOLDINGS INC., Kingston, NY (US)

(72) Inventors: Dov Shellef, Kingston, NY (US); Edo Shellef, Flower Mound, TX (US)

(73) Assignee: SHELLEF HOLDINGS INC., Kingston, NY (US)

( * ) Notice: Subject to any disclaimer, the term of this patent is extended or adjusted under 35 U.S.C. 154(b) by 68 days.

(21) Appl. No.: 16/166,838

(22) Filed: Oct. 22, 2018

(65) Prior Publication Data

US 2019/0119609 A1  Apr. 25, 2019

Related U.S. Application Data

(60) Provisional application No. 62/575,129, filed on Oct. 20, 2017.

(51) Int. Cl.
*C11D 7/50* (2006.01)
*C11D 11/00* (2006.01)
(Continued)

(52) U.S. Cl.
CPC ............. *C11D 7/5063* (2013.01); *C09K 5/04* (2013.01); *C09K 5/045* (2013.01); *C09K 5/10* (2013.01); *C11D 7/5018* (2013.01); *C11D 7/5022* (2013.01); *C11D 7/5059* (2013.01); *C11D 7/5077* (2013.01); *C11D 11/0017* (2013.01);
(Continued)

(58) Field of Classification Search
CPC ........................... C11D 7/5063; C11D 7/5022
See application file for complete search history.

(56) References Cited

U.S. PATENT DOCUMENTS

| 3,085,918 A | 4/1963 | Sherliker et al. |
| 4,715,900 A | 12/1987 | Connon et al. |
| (Continued) | | |

FOREIGN PATENT DOCUMENTS

| JP | 2003-165998 A | 6/2003 |
| JP | 2003-165999 A | 6/2003 |
| (Continued) | | |

OTHER PUBLICATIONS

WO 2017 179582 A1. English Translation. (Year: 2020).*
(Continued)

*Primary Examiner* — Mark Eashoo
*Assistant Examiner* — M. Reza Asdjodi
(74) *Attorney, Agent, or Firm* — Cantor Colburn LLP

(57) ABSTRACT

Disclosed herein are solvent compositions and methods of using the solvent compositions. The solvent composition includes at least trans-1,2-dichloroethylene (t-DCE) and 1,1,2,2-tetrafluoroethyl-2,2,3,3-tetrafluoropropyl ether (TFE-TFPE). The solvent composition may also include an oxygenated solvent, such as an alcohol or fluorinated ether. A method of cleaning the surface of an article includes contacting the surface with the solvent composition to dissolve, disperse, or displace a contaminant on the surface, and removing the solvent composition containing the contaminant from the surface.

19 Claims, 5 Drawing Sheets

(51) Int. Cl.

| | | |
|---|---|---|
| *C09K 5/10* | (2006.01) | |
| *C09K 5/04* | (2006.01) | |
| *H05K 3/26* | (2006.01) | |
| *D06L 1/02* | (2006.01) | |
| *C23G 5/028* | (2006.01) | |
| *B08B 3/10* | (2006.01) | |

(52) U.S. Cl.
CPC ...... *C11D 11/0047* (2013.01); *C23G 5/02812* (2013.01); *D06L 1/02* (2013.01); *H05K 3/26* (2013.01); *B08B 3/10* (2013.01); *C09K 2205/112* (2013.01); *C09K 2205/122* (2013.01); *C09K 2205/32* (2013.01); *H05K 2203/0783* (2013.01)

(56) References Cited

U.S. PATENT DOCUMENTS

| | | | |
|---|---|---|---|
| 5,196,137 | A | 3/1993 | Merchant |
| 5,542,983 | A | 8/1996 | Hamilton et al. |
| 5,908,822 | A | 6/1999 | Dishart |
| 6,030,934 | A | 2/2000 | Owens et al. |
| 6,764,990 | B1 | 7/2004 | Bogdan et al. |
| 7,053,035 | B2* | 5/2006 | Hanada ............... C11D 7/5018 510/177 |
| 7,071,154 | B2 | 7/2006 | Rajtar et al. |
| 7,276,471 | B2 | 10/2007 | Hitters et al. |
| 7,476,331 | B2 | 1/2009 | Merchant et al. |
| 7,494,603 | B2 | 2/2009 | Minor et al. |
| 7,498,296 | B2 | 3/2009 | Schweitzer et al. |
| 7,622,053 | B2 | 11/2009 | Minor et al. |
| 7,625,854 | B2 | 12/2009 | Owens |
| 7,629,307 | B2 | 12/2009 | Owens |
| 7,641,808 | B2 | 1/2010 | Schweitzer et al. |
| 7,744,774 | B2 | 6/2010 | Schweitzer et al. |
| 7,786,061 | B2 | 8/2010 | Minor et al. |
| 7,922,930 | B2 | 4/2011 | Schweitzer et al. |
| 7,927,502 | B2 | 4/2011 | Minor et al. |
| 8,044,010 | B2 | 10/2011 | Minor et al. |
| 8,163,197 | B2 | 4/2012 | Schweitzer et al. |
| 8,232,235 | B2 | 7/2012 | Owens |
| 8,399,713 | B2 | 3/2013 | Bartelt et al. |
| 8,410,039 | B2 | 4/2013 | Bartelt et al. |
| 8,703,690 | B2* | 4/2014 | Van Horn ........... C10M 171/008 510/408 |
| 9,267,065 | B2* | 2/2016 | Van Horn ................ C09K 3/30 |
| 9,428,717 | B2 | 8/2016 | Robin |
| 9,840,685 | B2 | 12/2017 | Robin et al. |
| 2004/0087465 | A1* | 5/2004 | DeGroot ............... C11D 7/5018 510/412 |
| 2004/0259752 | A1* | 12/2004 | DeGroot ............... C11D 7/504 510/415 |
| 2005/0070455 | A1 | 3/2005 | Hesselroth et al. |
| 2006/0180785 | A1 | 8/2006 | Merchant et al. |
| 2006/0266975 | A1 | 11/2006 | Nappa et al. |
| 2009/0186799 | A1 | 7/2009 | Owens |
| 2009/0186800 | A1 | 7/2009 | Owens |
| 2010/0209600 | A1 | 8/2010 | Bartelt et al. |
| 2011/0065620 | A1* | 3/2011 | Owens .................. C09K 5/045 508/582 |
| 2012/0138847 | A1* | 6/2012 | Van Horn ................ C09K 3/30 252/68 |
| 2016/0115428 | A1* | 4/2016 | Shellef ..................... B08B 1/00 427/379 |
| 2016/0326468 | A1* | 11/2016 | Robin ................. C11D 7/5063 |
| 2017/0283959 | A1* | 10/2017 | Shellef ................ C11D 7/5072 |
| 2018/0346841 | A1* | 12/2018 | Ikeda .................. C10M 131/10 |
| 2019/0119609 | A1* | 4/2019 | Shellef ................ C11D 7/5059 |
| 2019/0241843 | A1* | 8/2019 | Shellef ..................... B08B 3/00 |

FOREIGN PATENT DOCUMENTS

| | | | |
|---|---|---|---|
| JP | 2009-149701 A | 7/2009 | |
| WO | 00/17301 A1 | 3/2000 | |
| WO | 2007/100885 A2 | 9/2007 | |
| WO | 2009/025647 A1 | 2/2009 | |
| WO | 2010/094019 A2 | 8/2010 | |
| WO | 2011/031581 A2 | 3/2011 | |
| WO | 2016/182700 A1 | 11/2016 | |
| WO | 2017/138562 A1 | 8/2017 | |
| WO | WO-2017138562 A1 * | 8/2017 | ........... C11D 7/5018 |
| WO | 2017/176646 A1 | 10/2017 | |
| WO | 2017/179582 A1 | 10/2017 | |
| WO | WO-2017179582 A1 * | 10/2017 | ............. G01N 33/42 |

OTHER PUBLICATIONS

Jan. 23, 2019 International Search Report issued in International Application No. PCT/US2018/056901.

Jan. 23, 2019 Written Opinion issued in International Application No. PCT/US2018/056901.

* cited by examiner

COMPOSITIONS CONTAINING TRANS-1,2-DICHLOROETHYLENE AND A HYDROFLUOROETHER, AND METHODS OF USING THE SAME

This application claims the benefit of U.S. Provisional Application No. 62/575,129, filed Oct. 20, 2017. The disclosure of the prior application is hereby incorporated by reference herein in its entirety.

BACKGROUND

Solvent cleaning is used throughout a wide range of industries, including, for example, automotive, aerospace, jewelry and watchmaking, medical device, semiconductor, and telecommunications and data processing industries, as well as any industry that employs electronics and/or circuit boards. Cleaning of products and parts to remove contaminants, such as waxes, greases, oils, and solder flux residues, is an integral part of many manufacturing, maintenance, and refurbishing operations. Many articles or components are treated with oil or other processing agents during the fabrication process and it is frequently required that the oil and any other contaminants be removed before the article is ready for use or sale, or before the component is installed into the finished product. Additionally, contaminants, such as excess rosin flux, must often be removed from electronic or electrical components or devices, such as circuit boards, before they are acceptable for use because the presence of such contaminants could interfere with the performance of the electrical or electronic components and could also damage the components. Solvent cleaning processes, such as vapor degreasing and wet cleaning, can be used to remove contaminants from such articles and parts.

Cleaning solvents should have low toxicity and be safe to use, and should have a high solvency power. Solvent compositions have been significantly restricted over the past couple of decades due to environmental and safety concerns. Trichloroethylene (TCE) was a popular solvent for use in cleaning applications during the early 1970s. However, due to environmental issues related to water and ground pollution, TCE was replaced in many applications by chlorofluorocarbons (CFCs), such as CFC-113 in the late 1970s. TCE continues to face increasing regulations, in the United States and worldwide, and is also a potential carcinogen. CFC-113, however, contributes to the destruction of stratospheric ozone, and is characterized by a large ozone depletion potential (ODP). CFC-113, as well nearly all previously used CFCs, have since been banned as a result of the 1987 Montreal Protocol. Following this ban, solvents with low, but not zero ODPs were developed, including hydrochlorofluorocarbons (HCFCs), such as HCFC-141b and HCFC-225. These solvents are now scheduled for phase-out in the near future due to their ozone depleting characteristics. Therefore, it is preferred that solvent compositions have zero ODP and low global warming potential (GWP).

A need thus exists for solvents that are characterized by high solvency power, low toxicity, zero ODP, and low GWP.

SUMMARY

Disclosed herein is a solvent composition including at least trans-1,2-dichloroethylene (t-DCE) and 1,1,2,2-tetrafluoroethyl-2,2,3,3-tetrafluoropropyl ether (TFE-TFPE). In one embodiment, the solvent composition includes t-DCE in an amount in a range of from 70 to 99.9 wt. %, and TFE-TFPE in an amount in a range of from 0.1 to 30 wt. %.

In another embodiment, the solvent composition includes t-DCE in an amount in a range of from 65 to 98 wt. %, TFE-TFPE in an amount in a range of from 0.1 to 30 wt. %, and an oxygenated solvent in an amount in a range of from 0.1 to 15 wt. %. The solvent compositions are characterized by high solvency power, low toxicity, zero ODP, and low GWP.

Methods of using the solvent compositions are also disclosed. For example, a method of cleaning a surface of an article includes contacting the surface with the solvent composition to dissolve, disperse, or displace a contaminant on the surface, and removing the solvent composition containing the contaminant from the surface. A method for depositing a coating material on a substrate includes applying a coating mixture including a coating material and the solvent composition to at least a portion of the substrate, and evaporating the solvent composition from the substrate. A method for lubricating an object includes contacting the object with a working fluid including the solvent composition to lubricate the object. A heat-transfer method includes directly or indirectly contacting a heat-transfer fluid including the solvent composition with a heat sink or source to conduct heat directly or indirectly to or from the heat sink or source.

DETAILED DESCRIPTION OF EMBODIMENTS

Figure 1:
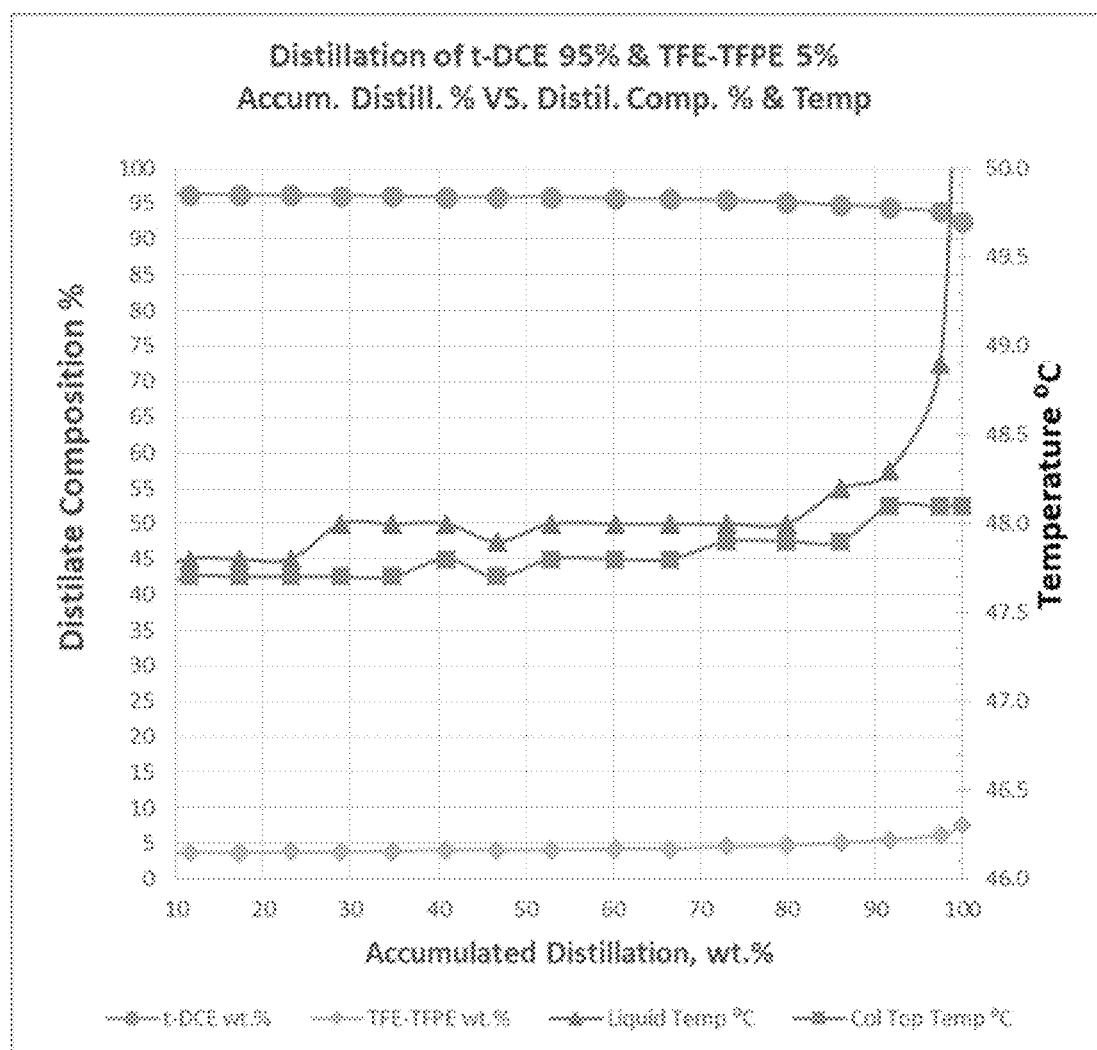
FIG. 1 is a line chart showing the average compositions and temperatures of successive distillate fractions of a composition of about 96.0±0.3 wt. % t-DCE and 4.0±0.3 wt. % TFE-TFPE (as the HFE).

Disclosed herein are solvent compositions, and methods of using the compositions. The compositions include at least t-DCE and a hydrofluoroether. For example, in one embodiment, the composition includes t-DCE and TFE-TFPE. The composition may optionally include an oxygenated solvent, such as an alcohol or fluorinated ether. In some embodiments, the solvent compositions disclosed herein may be azeotrope or azeotrope-like compositions. In other embodiments, the solvent compositions are non-azeotropic mixtures.

Regardless of whether the compositions are azeotropes, azeotrope-like, or non-azeotropic, the solvent compositions disclosed herein are characterized by high solvency power, low toxicity, zero ODP, and low GWP. The provided compositions have utility in a number of applications including solvent cleaning, coating deposition, heat transfer processes, and many others.

The present disclosure also provides methods for using the solvent composition. For example, in one aspect, the present disclosure provides methods for cleaning a surface of an article, including vapor degreasing methods, as well as methods for depositing a coating material on a substrate, heat-transfer methods, and methods for lubricating objects, all of which use the solvent composition.

Solvent Compositions

The solvent compositions disclosed herein include at least t-DCE and a hydrofluoroether. For example, in some embodiments, the solvent composition includes t-DCE and TFE-TFPE.

As used herein, "trans-1,2-dichloroethylene" or "t-DCE" refers to, e.g., the trans isomer of an organochloride with the molecular formula, $C_2H_2Cl_2$. T-DCE is considered to be a flammable solvent, but has exceptional cleaning power and a lower toxicity compared to equivalent chlorinated solvents, such as trichloroethylene, tetrachloroethylene, and methylene dichloride. It has been surprising to discover that the present compositions can be nonflammable even when they contain relatively large amounts of t-DCE. In some embodiments, the composition has no measurable flash point.

As used herein, "1,1,2,2-tetrafluoroethyl-2,2,3,3-tetrafluoropropyl ether" or "TFE-TFPE" refers to an ether having the formula $C_5H_4F_8O$ in which eight of the hydrogen atoms has been replaced by a fluorine atom, and is represented by the following formula:

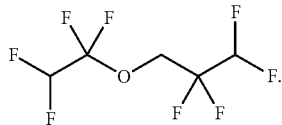 [SMILES: FC(F)C(F)(F)COC(F)(F)C(F)F]

Unless otherwise indicated, the amounts disclosed herein for any of the substances or solvent components included in the composition are based on a total weight of the composition.

As used herein, the modifier "about" used in connection with a quantity is inclusive of the stated value and has the meaning dictated by the context. For example, it includes at least the degree of error associated with the measurement of the particular quantity. When used in the context of a range, the modifier "about" should also be considered as disclosing the range defined by the absolute values of the two endpoints. For example, the range "from about 2 to about 4" also discloses the range "from 2 to 4."

In a binary composition, t-DCE and TFE-TFPE may be present in amounts effective for forming a solvent composition having high solvency power. For example, t-DCE may be present in the composition in an amount in a range of from about 70 wt. % to about 99.9 wt. %, about 80 wt. % to about 99 wt. %, or about 90 wt. % to about 95 wt. %. TFE-TFPE may be present in the binary composition in an amount in a range of from about 0.1 wt. % to about 30 wt. %, about 1 wt. % to about 20 wt. %, or about 5 wt. % to about 10 wt. %.

In some embodiments, the composition may be an azeotrope or may be azeotrope-like, as discussed in more detail below. In such embodiments, t-DCE and TFE-TFPE may be present in relative azeotrope or azeotrope-like amounts within the above ranges. In other embodiments, the composition is non-azeotropic, in which case t-DCE and TFE-TFPE may be present in amounts within the above ranges that are not effective for forming an azeotrope or azeotrope-like composition.

The solvent composition may optionally include an oxygenated solvent. The oxygenated solvent may be an alcohol or fluorinated ether. Non-limiting examples of the alcohol include methanol, ethanol, n-propanol, iso-propanol, n-butanol, iso-butanol, t-butanol, and any other suitable alcohol suitable for use in a solvent composition. Non-limiting examples of the fluorinated ether include 3-methoxyperfluoro(2-methylpentane) (HFE-7300) and methylperfluoroheptene ether (MPHE).

MPHE includes an isomeric mixture of unsaturated fluoroethers, which are the products of the reaction of perfluoroheptenes, such as perfluoro-3-heptene with methanol in the presence of a strong base. In one embodiment, the mixture comprises a mixture of one or more of the following compounds: $CF_3CF_2CF=CFCF(OR)CF_2CF_3$, $CF_3CF_2C(OR)=CFCF_2CF_2CF_3$, $CF_3CF=CFCF(OR)CF_2CF_2CF_3$, and $CF_3CF_2CF=C(OR)CF_2CF_2CF_3$; where $R=CH_3$.

In a ternary composition including t-DCE, TFE-TFPE, and an oxygenated solvent, amounts of all three components may be effective for forming a composition having high solvency power. For example, t-DCE may be present in the composition in an amount in a range of from about 65 wt. % to about 99.9 wt. %, about 72 wt. % to about 98 wt. %, or about 80 wt. % to about 90 wt. %. TFE-TFPE may be present in the composition in an amount in a range of from about 0.1 wt. % to about 30 wt. %, about 0.5 wt. % to about 20 wt. %, or about 1 wt. % to about 10 wt. %. The oxygenated solvent may be present in an amount in a range of from about 0.1 wt. % to about 15 wt. %, about 0.5 wt. % to about 10 wt. %, or about 1 wt. % to about 5 wt. %.

In some embodiments, the composition may be an azeotrope or may be azeotrope-like, as discussed in more detail below. In such embodiments, t-DCE, TFE-TFPE, and the oxygenated solvent may be present in relative azeotrope or azeotrope-like amounts within the above ranges. In other embodiments, the composition is non-azeotropic, in which case t-DCE, TFE-TFPE, and the oxygenated solvent may be present in amounts within the above ranges that are not effective for forming an azeotrope or azeotrope-like composition.

Many of the compositions disclosed herein are nonflammable. As used herein, the term, "nonflammable," refers to, e.g., the absence of a flash point up to the boiling point of the composition at standard atmospheric pressure as determined in accordance with one or more of ASTM D56, D1310, and D3278. In some embodiments, the composition will satisfy the criteria for nonflammability as set forth in ASTM D3065 where it is delivered via aerosol.

As mentioned above, in some embodiments, the composition may be an azeotrope or azeotrope-like composition. For example, the composition may be a binary azeotrope or azeotrope-like composition, including t-DCE and TFE-TFPE in relative azeotrope or azeotrope-like amounts. In another embodiment, the composition may be a ternary azeotrope, including t-DCE, TFE-TFPE, and an oxygenated solvent, in relative azeotrope or azeotrope-like amounts. Azeotrope or azeotrope-like compositions may be advantageous in some embodiments because the solvency properties of such compositions remain constant during use, even under boiling conditions. The azeotropic or azeotrope-like compositions advantageously may be re-distilled and re-used without substantial composition change or loss of the composition.

As used herein, "azeotrope" and "azeotropic composition" refer to an admixture of two or more substances in which the admixture distills without substantial composition change and behaves as a constant boiling composition. Constant boiling compositions, which are characterized as azeotropic, exhibit either a maximum or a minimum boiling point, as compared with that of the non-azeotropic mixtures of the same substances. Azeotropic compositions as used herein include homogeneous azeotropes, which are liquid admixtures of two or more substances that behave as a single substance, in that the vapor, produced by partial evaporation or distillation of the liquid, has the same composition as the liquid. For example, in homogeneous azeotropes, the components are completely, or nearly completely, miscible in one another. Therefore, homogeneous azeotropes form a single liquid phase, while heterogeneous azeotropes form two-phase mixtures. The azeotropic compositions disclosed herein can also include heterogeneous azeotropes where the liquid phase splits into two or more liquid phases. In these embodiments, at the azeotropic point, the vapor phase is in equilibrium with two liquid phases and all three phases have different compositions. If the two equilibrium liquid phases of a heterogeneous azeotrope are combined and the composition of the overall liquid phase calculated, this would be identical to the composition of the vapor phase. The compositions disclosed herein are mostly homogeneous azeotropes or azeotrope-like compositions.

As used herein, the term "azeotrope-like composition," also sometimes referred to as "near azeotropic composition," means a constant boiling, or substantially constant boiling liquid admixture of two or more substances that behaves as a single substance. One way to characterize an azeotrope-like composition is that the vapor produced by partial evaporation or distillation of the liquid has substantially the same composition as the liquid from which it was evaporated or distilled. That is, the admixture distills/refluxes without substantial composition change. For example, the total compositional change between the vapor and the liquid after the admixture distills/refluxes is about 10% or less, or about 5% or less. A composition is azeotrope-like if, for example, after 50 wt. % of the composition is removed, such as by evaporation or boiling off, the difference in vapor pressure between the original composition and the composition remaining after 50 wt. % of the original composition has been removed by evaporation or boiling off is less than about 10%.

An azeotropic or azeotrope-like composition, by definition, must include at least two components. The most common azeotropic systems are binary azeotropes and contain two components. Ternary azeotropes contain three components. Azeotropes of four or more components also exist. Disclosed herein are azeotropes or azeotrope-like compositions of at least two components. For example, the composition may be a binary azeotropic or azeotrope-like composition, which contains two components, a ternary azeotropic or azeotrope-like composition, which contains three components, or a quaternary azeotropic or azeotrope-like composition containing four components.

It follows from the above that azeotropic and azeotrope-like compositions encompass a range of compositions containing the same components in varying proportions, all of which are azeotropic or azeotrope-like. For example, the concentration of an azeotrope will vary relative to the pressure of the system. A person skilled in the art of distillation understands that changing the pressure of the system will change the concentration of each component of the azeotrope. All such compositions are intended to be covered by the term "azeotrope" or "azeotrope-like" as used herein.

One way to determine if a mixture is an azeotrope or azeotrope-like is through fractional distillation. Multiple steps of evaporation and condensation of a mixture can be performed via a fractional distillation column. Such a system is designed to separate a mixture of liquid substances into individual, pure substances based on differences in their boiling points. If the mixture does not separate by fractional distillation, it is azeotropic or azeotrope-like. Analyzing the distilled fractions from a fractional distillation column can identify the concentrations of the azeotropic or azeotrope-like mixture.

A fractional distillation column can also be used to accurately determine the boiling point of the azeotrope. If a maximum or minimum temperature is reached relative to the individual substances, an azeotrope or azeotrope-like composition is present.

The azeotropic or azeotrope-like compositions can possess the properties needed for de-fluxing, de-greasing applications, and other cleaning applications. The inherent invariance of the compositions under boiling conditions ensures that the ratios of the individual components of the mixture will not change substantially during use and that solvency properties will remain constant as well.

The azeotropic and azeotrope-like compositions are thus useful in cleaning, defluxing, and degreasing processes, such as a vapor degreaser. Most of the present compositions are nonflammable, and as they do not fractionate, most will not produce flammable compositions during use. Additionally, the azeotropic or azeotrope-like solvent compositions may be re-distilled and re-used without substantial composition change.

As mentioned above, in one embodiment, the solvent composition is a binary azeotrope or azeotrope-like composition including t-DCE and TFE-TFPE. The t-DCE and TFE-TFPE may be present in amounts effective for forming a binary azeotrope or azeotrope-like composition. The composition may be a homogeneous azeotrope or azeotrope-like composition.

For example, in one embodiment, the composition may be a binary azeotrope or azeotrope-like composition including t-DCE in an amount in a range of from about 80 to about 99.9 wt. %, about 85 to about 99.5 wt. %, or about 90 to about 97 wt. %, and TFE-TFPE in an amount in a range of from about 0.1 to about 15 wt. %, about 0.5 wt. % to about 10 wt. %, or about 1 wt. % to about 8 wt. %.

In some embodiments, the distillate fraction of the azeotrope or azeotrope-like compositions may boil at a temperature in a range of from about 40 to about 60° C., about 43 to about 58° C., or about 46 to about 55° C. at atmospheric pressure. In one embodiment, the azeotrope or azeotrope-like compositions may include t-DCE in an amount within one of the above ranges, with a vapor pressure of about 1 atm, at a temperature ranging from about 46.9° C. to about 49.9° C.

In another embodiment, the composition may be a ternary azeotrope or azeotrope-like composition including t-DCE, TFE-TFPE, and an oxygenated solvent, with amounts of all three components being effective form forming a ternary azeotrope or azeotrope-like composition. The composition may be a homogeneous azeotrope or azeotrope-like composition.

The ternary azeotrope or azeotrope-like composition may include t-DCE, TFE-TFPE, and an oxygenated solvent in relative azeotrope or azeotrope-like amounts. For example, t-DCE may be present in the composition in an amount in a range of from about 65 wt. % to about 99.9 wt. %, about 75 wt. % to about 99 wt. %, or about 85 wt. % to about 97 wt. %. TFE-TFPE may be present in the composition in an amount in a range of from about 0.1 wt. % to about 25 wt. %, about 1 wt. % to about 15 wt. %, or about 2 wt. % to about 8 wt. %. The oxygenated solvent may be present in an amount in a range of from about 0.1 wt. % to about 25 wt. %, about 0.5 wt. % to about 20 wt. %, or about 1 wt. % to about 15 wt. %.

In some embodiments, the distillate fraction of the azeotrope or azeotrope-like compositions may boil at a temperature in a range of from about 38° C. to about 55° C., about 40° C. to about 50° C., or about 42° C. to about 48° C. at atmospheric pressure. In one embodiment, the azeotrope or azeotrope-like compositions may include t-DCE in an amount within one of the above ranges, with a vapor pressure of about 1 atm, at a temperature ranging from about 40 to about 48.6° C.

For example, in one embodiment, the oxygenated solvent may be an alcohol, such as methanol. Methanol may be present along with t-DCE and TFE-TFPE in relative azeotrope or azeotrope-like amounts. For example, the composition may include (i) methanol in an amount of from about 0.1 to about 10.0 wt. %, about 2.0 to about 10.0 wt. %, or about 5.0 to about 10.0 wt. %, (ii) TFE-TFPE in an amount of about 0.1 to about 25 wt. % or about 3.0 to about 24.0 wt. %, and (iii) t-DCE in an amount of from about 65.0 to about 97.5 wt. % or about 70.0 to about 95.0 wt. %.

In another embodiment, the alcohol may be ethanol. Ethanol may be present along with t-DCE and TFE-TFPE in relative azeotrope or azeotrope-like amounts. For example, the composition may include (i) ethanol in an amount of from about 0.1 to about 9.5 wt. %, about 3.1 to about 7.0 wt. %, or about 4.0 to about 6.5 wt. %, (ii) TFE-TFPE in an amount of about 0.1 to about 29.5 wt. % or about 3.0 to about 24.0 wt. %, and (iii) t-DCE in an amount of from about 61.0 to about 97.5 wt. %, or about 69.0 to about 95.0 wt. %.

In another embodiment, the alcohol may be isopropanol. Isopropanol may be present along with t-DCE and TFE-TFPE in relative azeotrope or azeotrope-like amounts. For example, the composition may include (i) isopropanol in an amount of from about 0.1 to about 7.5 wt. %, about 1.5 to about 7.0 wt. %, or about 2.1 to about 5.0 wt. %, (ii) TFE-TFPE in an amount of about 0.1 to about 45 wt. % or about 3.0 to about 40.0 wt. %, and (iii) t-DCE in an amount of from about 47.5 to about 96.0 wt. % or about 53.0 to about 95.0 wt. %.

In another embodiment, the alcohol may be t-butanol. T-butanol may be present along with t-DCE and TFE-TFPE in relative azeotrope or azeotrope-like amounts. For example, the composition may include (i) t-butanol in an amount of from about 0.1 to about 6.0 wt. %, about 0.25 to about 4.0 wt. %, or about 0.5 to about 2.0 wt. %, (ii) TFE-TFPE in an amount of about 0.1 to about 29.5 wt. % or about 4.0 to about 25.0 wt. %, and (iii) t-DCE in an amount of from about 70.0 to about 97.5 wt. %, or about 75.0 to about 97.0 wt. %.

In another embodiment, the alcohol may be 1-propanol. 1-Propanol may be present along with t-DCE and TFE-TFPE in relative azeotrope or azeotrope-like amounts. For example, the composition may include (i) 1-propanol in an amount of from about 0.1 to about 4.0 wt. %, about 0.1 to about 3.0 wt. %, or about 0.2 to about 2.0 wt. %, (ii) TFE-TFPE in an amount of about 0.1 to about 25 wt. % or about 4.0 to about 20.0 wt. %, and (iii) t-DCE in an amount of from about 65.0 to about 97.5 wt. %, or about 78.0 to about 95.0 wt. %.

In another embodiment, the alcohol may be 2-butanol. 2-Butanol may be present along with t-DCE and TFE-TFPE in relative azeotrope or azeotrope-like amounts. For example, the composition may include (i) TFE-TFPE in an amount of about 0.1 to about 25 wt. %, (ii) t-DCE in an amount of from about 65.0 to about 97.5 wt. %, and (iii) 2-butanol in an amount of from about 0.1 to about 10.0 wt. %.

In another embodiment, the oxygenated solvent may be a fluorinated ether, such as MPHE. MPHE may be present along with t-DCE and TFE-TFPE in relative azeotrope or azeotrope-like amounts. For example, the composition may include (i) MPHE in an amount of from about 0.1 to about 10.0 wt. %, about 0.5 to about 8.0 wt. %, or about 1.0 to about 5.0 wt. %, (ii) TFE-TFPE in an amount of about 0.1 to about 25 wt. % or about 3.0 to about 24.0 wt. %, and (iii) t-DCE in an amount of from about 65.0 to about 97.5 wt. % or about 70.0 to about 95.0 wt. %.

In another embodiment, the ether may be HFE-7300. HFE-7300 may be present along with t-DCE and TFE-TFPE in relative azeotrope or azeotrope-like amounts. For example, the composition may include (i) HFE-7300 in an amount of from about 1.0 to about 30.0 wt. %, about 5.0 to about 25.0 wt. %, or about 10.0 to about 20.0 wt. %, (ii) TFE-TFPE in an amount of about 0.1 to about 20 wt. % or about 0.5 to about 15.0 wt. %, and (iii) t-DCE in an amount of from about 65.0 to about 97.5 wt. % or about 70.0 to about 95.0 wt. %.

In yet another embodiment, the composition may be a quaternary azeotropic or azeotrope-like composition containing t-DCE, TFE-TFPE, HFE-7300, and MPHE in relative azeotrope or azeotrope-like amounts. For example, the composition may include (i) HFE-7300 in an amount of from about 1.0 to about 30.0 wt. %, about 5.0 to about 25.0 wt. %, or about 10.0 to about 20.0 wt. %, (ii) MPHE in an amount of from about 0.1 to about 10.0 wt. %, about 0.5 to about 8.0 wt. %, or about 1.0 to about 5.0 wt. %, (iii) TFE-TFPE in an amount of about 0.1 to about 20 wt. % or about 0.5 to about 10.0 wt. %, and (iv) t-DCE in an amount of from about 65.0 to about 97.5 wt. % or about 70.0 to about 95.0 wt. %.

In the embodiments in which the compositions are azeotropic or azeotrope-like, the compositions may be re-distilled and re-used without substantial composition change without significant loss of the composition. The azeotropes and azeotrope-like compositions are very easy to distil and recover. If used in a vapor degreaser, the composition can be continuously boiled and recycled with little waste while the contaminants stay trapped at the bottom of the machine. The azeotropes and azeotrope-like compositions are ideal for vapor degreasing because they do not fractionate upon boiling, and the distillate and residue do not have substantial changes in composition. Therefore, the composition is not shifted into a flammable range during vapor degreasing. The disclosed compositions are also advantageous for use in a number of applications other than vapor degreasing. For example, the compositions have utility in other solvent cleaning applications, dewatering and drying processes, coating deposition, heat-transfer processes, foaming blowing applications, refrigeration flushing, lubrication applications, and many others.

The use of homogenous azeotrope and azeotrope-like compositions is particularly advantageous. For example, a homogeneous azeotrope or azeotrope-like composition behaves as a single substance. As a result, the solvency power and other properties of the composition are not only constant even under boiling conditions due to its azeotropic nature, but are also uniform and consistent due to the homogenous nature of the azeotrope or azeotrope-like composition. Such consistent and uniform properties are advantageous in all applications, including, for example, coating deposition processes, in which the composition is used to deposit a coating, such as paints, lubricants, adhesives, penetrants, and surface protectants, onto a substrate; solvent cleaning, such as vapor degreasing and wet cleaning; dewatering and drying processes; heat-transfer processes; foaming blowing applications; refrigeration flushing; lubrication applications; and many others.

Regardless of whether the composition is azeotropic, azeotropic-like, or non-azeotropic, the disclosed compositions have high solvency power, and are characterized by zero ODP and low GWP, as well as low toxicity. Many of the compositions are nonflammable or have reduced flammability. The compositions are therefore advantageously used in a variety of applications, such as solvent cleaning, such as vapor degreasing and wet cleaning; dewatering and drying processes; deposition of a coating, such as paints, lubricants, adhesives, penetrants, and surface protectants, onto a substrate; heat-transfer processes; foaming blowing applications; refrigeration flushing; lubrication applications; and many others.

The solvent compositions, which include a range of concentrations of the various solvent components, can be formulated to have varying degrees of cleaning and dissolving power. For example, t-DCE exhibits strong solvent cleaning properties, but is considered to be flammable. TFE-TFPE exhibits relatively good solvent properties and is nonflammable, but generally lacks the aggressiveness of t-DCE. Therefore, the composition can be formulated such that the aggressive tendencies of t-DCE are tempered by the combination of t-DCE with even just small amounts of TFE-TFPE, and optionally an oxygenated solvent. The solvent composition as formulated is acceptable for use in essentially all of the electrical, electromechanical, mechanical, and other applications disclosed herein. The unique combination of solvent components provides a composition in which the aggressiveness of the solvent composition can be varied to suit a desired application. The solvent compositions are advantageously characterized by zero ODP and low GWP, as well as low toxicity, and in some embodiment are also nonflammable.

In one embodiment, the composition may consist only or predominantly of t-DCE, TFE-TFPE, and optionally an oxygenated solvent. As discussed below, the composition may also contain other components that do not materially affect the composition's exceptional cleaning power. In the embodiments in which the composition is an azeotrope or azeotrope-like composition, the composition may contain other components that do not materially affect the compositions' exceptional cleaning power or azeotropic properties.

Additives

The present composition may contain one or more additives, such as stabilizers, inhibitors, surfactants, acid acceptors, metal passivators, lubricious additives, and antioxidants.

In some embodiments, co-solvents or surfactants may be present to, for example, improve the dispersibility or the solubility of intended solutes, such as water, soils, or coating materials in a provided composition. For example, minor amounts of co-solvents can be added to the compositions, as long as the addition does not disrupt the cleaning power or the azeotropic behavior if the composition is an azeotrope or azeotrope-like composition. Useful co-solvents may include, for example, hydrofluorocarbons (HFCs), hydrocarbons, hydrochlorocarbons (HCCs), or water. Non-limiting examples of suitable co-solvents include: carbon dioxide; 1,1-difluoroethane; 1-hydropentadecafluoroheptane; 1,1,1,2-tetrafluoroethane; 1,1,1,3,3-pentafluoropropane; 2-chloropropane; water; saturated perfluorochemicals (e.g., perfluoropentane, perfluorohexane, and perfluoro(N-methylmorpholine)); and combinations thereof. In some embodiments, the compositions may further include hydrofluoric acid (HF).

As mentioned above, the present compositions may further include at least one surfactant. The surfactants include all surfactants known in the art for dewatering or drying of substrates. Non-limiting examples of surfactants include alkyl phosphate amine salts (such as a 1:1 salt of 2-ethylhexyl amine and isooctyl phosphate); ethoxylated alcohols, mercaptans and alkylphenols; quaternary ammonium salts of alkyl phosphates (with fluoroalkyl groups on either the ammonium or phosphate groups); and mono- or di-alkyl phosphates of fluorinated amines.

The amount of surfactant included in the present compositions can vary widely depending on the particular application in which the composition is being used, but is readily apparent to those skilled in the art. In one embodiment, the amount of surfactant dissolved in the unsaturated fluorinated ether solvent is not greater than about 1 wt. %, based on the total weight of the surfactant/solvent composition. In another embodiment, larger amounts of surfactant can be used, if after treatment with the composition, the substrate being dried is thereafter treated with solvent containing either no or minimal surfactant. For example, the surfactant may be used in an amount of from about 0.1 to about 25 wt. %, about 0.5 to about 15 wt. %, or about 1 to about 10 wt. %.

In one embodiment, small amounts of one or more fluorocarbons may be added to the composition. For example, small amounts of one or more fluorocarbons may be added to the binary composition of t-DCE and TFE-TFPE, or may be added to the ternary or quaternary composition of t-DCE, TFE-TFPE, and one or more oxygenated solvents. In embodiments where the composition is an azeotrope or azeotrope-like composition, the fluorocarbon is added in a manner such that the azeotropic behavior is not disturbed. Non-limiting examples of the fluorocarbons include heptafluorocyclopentane, perfluoro(2-methyl-2-pentene), (E-Z)perfluoro(4-methyl-2-pentene), 1,1,1,4,4,5,5,5-octafluoro-2-pentene, perfluorobutyl methyl ether, perfluorobutyl ethyl ether, perfluoroisopropylmethyl ether, perfluoroethyl isopropyl ketone, E-1,1,1-trifluoro-3-chloro-2-propene, 1,1,1,3,3-pentafluorobutane, 1,1,2,2-tetrafluoroethyl 2,2,2-trifluoroethyl ether, and any other fluorocarbon suitable for use in the solvent compositions. The fluorocarbon may be present in an amount in a range of from about 0.01 to about 5 wt. %, about 0.1 to about 2.5 wt. %, or about 0.5 to about 1 wt. %. Such compositions may, in some embodiments, have reduced flammability. For example, the addition of amounts as low as from 0.6 weight percent to 1.5 wt. % of the above fluorocarbons results in compositions that do not exhibit a measurable flash point in closed cup flash point testing.

In one embodiment, the present compositions may further comprise a propellant. Aerosol propellant may assist in delivering the present composition from a storage container to a surface in the form of an aerosol. Aerosol propellant is optionally included in the present composition in an amount up to about 25 wt. % based on the total weight of the composition. Representative aerosol propellants include air, nitrogen, carbon dioxide, 2,3,3,3-tetrafluoropropene (HFO-1234yf), trans-1,3,3,3-tetrafluoropropene (HFO-1234ze), 1,2,3,3,3-pentafluoropropene (HFO-1225ye), difluoromethane ($CF_2H_2$, HFC-32), trifluoromethane ($CF_3H$, HFC-23), difluoroethane ($CHF_2CH_3$, HFC-152a), trifluoroethane ($CH_3CF_3$, HFC-143a; or $CHF_2CH_2F$, HFC-143), tetrafluoroethane ($CF_3CH_2F$, HFC-134a; or $CF_2HCF_2H$, HFC-134), pentafluoroethane ($CF_3CF_2H$, HFC-125), and hydrocarbons, such as propane, butanes, pentanes, dimethyl ether, and combinations thereof.

In some embodiments, small amounts of lubricious additives may be present to, for example, enhance the lubricating properties of the composition. Examples of suitable lubricious additives include: mineral oils, fatty esters, highly halogenated oils such as chlorotrifluoroethylene-containing polymers, and synthetic lubricious additives such as alkylene oxide polymers.

In one embodiment, antistatic additives may be present in the composition. For example, boiling and general circulation of dewatering compositions in conventional drying and cleaning equipment can create static charge, particularly in the latter stages of the drying process where most of the water has been removed from a substrate. Such static charge collects on non-conductive surfaces of the substrate and prevents the release of water from the surface. The residual water dries in place resulting in undesirable spots and stains on the substrate. Static charge remaining on substrates can bring out impurities from the cleaning process or can attract impurities such as lint from the air, which results in unacceptable cleaning performance. In one embodiment, the present composition is a dewatering composition containing an antistatic additive, which is effective in both the dewatering and drying and rinse steps of a method to dewater or dry a substrate as described below.

Suitable antistatic additives include, for example, polar compounds, which are soluble in the fluorinated ether solvent disclosed herein and result in an increase in the conductivity of the fluorinated ether solvent resulting in dissipation of static charge from a substrate. In one embodiment, the antistatic additives have a normal boiling point near that of the fluorinated ether solvent and have minimal to no solubility in water. In another embodiment, the antistatic additives have solubility in water of less than about 0.5 wt. %. In one embodiment, the solubility of antistatic agent is at least 0.5 wt. % in fluorinated ether solvent. The antistatic additive may be, for example, nitromethane, nitroethane, or acetonitrile.

Such additives typically are added in amounts known to one skilled in the art. The amount of the additive can vary widely depending on the particular additive and/or application in which the composition is being used, but is readily apparent to those skilled in the art. The total amount of additives may be in an amount of up to about 20 wt. %, about 10 wt. %, or about 5 wt. % based on the total weight of the composition. More specifically, these optional components may be present in an amount of about 0.01 wt. % to about 15 wt. %, about 0.1 wt. % to about 7 wt. %, or about 0.1 wt. % to about 2 wt. % based on a total weight of the composition.

Methods of Preparing the Composition

The present compositions may be prepared by admixing t-DCE, the hydrofluoroether, and the oxygenated solvent in amounts effective for forming a solvent composition with good solvency properties. For example, t-DCE and TFE-TFPE may be mixed together to form a solvent composition. In another embodiment, an oxygenated solvent may be combined with t-DCE and TFE-TFPE to form a solvent composition. The order of addition of the components is not critical. When desired, one or more other components or additives, such as those discussed above, may be optionally added to any of the solvent mixtures.

In some embodiments, t-DCE, a hydrofluoroether, and an oxygenated solvent are admixed in amounts effective for forming an azeotrope or azeotrope-like composition. For example, t-DCE may be mixed with TFE-TFPE in relative azeotrope or azeotrope-like amounts to form a binary azeotrope or azeotrope-like composition. In another embodiment, t-DCE may be mixed with TFE-TFPE and one or more oxygenated solvents in relative azeotrope or azeotrope-like amounts to form a ternary or quaternary azeotrope or azeotrope-like composition.

Methods of Cleaning

A method of cleaning a surface includes contacting the surface with the solvent composition to dissolve, displace, or disperse one or more contaminants on the surface. The composition may then be removed from the surface. The method of cleaning reduces the level of contaminants on the surface. Therefore, after contacting the surface with the composition, the surface is substantially free of contaminants and is also substantially free of residue from the solvent composition.

The solvent composition disclosed herein may be used to clean the surface of any device, article of manufacture, product, part, component, substrate, or any portion thereof that may be subject to contamination by unwanted materials. For example, the solvent composition may be used to clean the surface of machine parts, tools, component assemblies, complex metal parts, implantable prosthetic devices, electrical and electronic components, switches, circuits, boards, printed circuit boards, semiconductor chips, magnetic media, disk drive heads, avionics, connectors, relays and contacts, solenoids, motor and motor windings, circuit breakers, circuit breaker panels, transformers, electrical and data communication connectors and switching devices, electronic controls, timers, cable assemblies, splices and terminations, hydraulic and pneumatic equipment, optical equipment, fiber optics, metal or metal oxide products, glass products, plastics, elastomers, photographic and movie film, molds for casting plastics, surfaces being prepared for painting, fabrics, animal hides, ceramics, stone or stone-like materials such as concrete, wood, natural fibers, synthetic fibers, PVC pipes, optical lenses, polymeric substrates, and the like, and any portion thereof. The surface may be of an article connected to a power source, such as an AC power source, a battery, or the like.

The term, "contaminant" is used in a broad sense to designate any unwanted material or substance present on the article, even if the material or substance was placed on the article intentionally. For example, circuit boards, commonly used in electronic appliances, such as televisions and computers, are often contaminated with solder flux in the assembly process. Solder flux is a grease-like substance that is either applied to the surface of the board before soldering, or is contained in the core of the solder itself, in order to help the solder retain heat and spread onto a surface. This sticky flux residue must then be removed from the surface of the circuit board. Non-limiting examples of "contaminant"

include flux (e.g., solder flux), grease, wax, oil, polymer, lubricant, dirt, lint, dust, particulate matter, corrosive materials, oxidation products, residue, and the like. For example, the composition may be used to remove relatively heavy motor oil and lighter weight oils, such as machine oils or other light-weight lubricants, such as silicone or Teflon® polytetrafluoroethylene (PTFE).

The composition may be used to clean electronic or electrical devices or components, such as integrated circuits or silicon chips. For example, it is necessary to clean silicon chips are manufacturing simply to remove any possible contamination, as these delicate parts must be absolutely clean to perform properly.

The contacting of the article with the composition may be performed in a variety of ways. In some embodiments, the contacting is performed via wet cleaning or vapor degreasing. The wet cleaning can be performed on, for example, any of the above articles, including electronic or electrical components or devices.

The contacting step may be performed in any suitable apparatus or vessel, including, for example, in a reaction vessel, sump, vat, dip tank, autoclave, vapor degreaser, or the like, and may be conducted while open or closed to the atmosphere. In some embodiments, the contacting need not be performed in an apparatus or vessel at all.

The wet cleaning may be performed via a parts washer, any batch loaded, non-boiling degreaser, sprays, aerosols, and the like. For example, the wet cleaning may involve spraying the composition onto the article, flushing the article with the composition, wiping the article with an absorbent medium containing the composition, or immersing the article in the composition. In some embodiments, the composition is sprayed onto the surface of the article. The composition may be sprayed in the form of a liquid or an aerosol. For example, a jet stream of the present composition may be sprayed onto the article. The composition may be sprayed onto the article from a trigger bottle or pump sprayer. The surface of the article can be brushed or wiped before, during, or after spraying the composition onto the surface of the article. For example, the article may be brushed or wiped to assist in cleaning, particularly if the article contains an excessive amount of contaminants. Such brush or wiping can be effective in enhancing penetration of the contaminants by the solvent composition.

In some embodiments, the composition may be sprayed onto the surface as an aerosol. In such embodiments, the composition may be combined with a propellant to create an aerosol, such the propellants discussed above. The propellant may be present in the aerosol in an amount of about 3 to about 50 wt. % based on a total weight of the aerosol.

The aerosol may be inserted into an aerosol container capable of spraying the aerosol and/or mixed with boron nitride powder and/or other compatible powder additives, such as metal powders, to create an aerosol mixture. The aerosol spray container, such as an aerosol can, can be used to spray the aerosol onto the surface of an article.

In some embodiments, wet cleaning may involve fully or partially immersing or soaking an article in the composition with or without agitation. For example, the wet cleaning may be performed by contacting the article in a sump, vat, dip tank, or the like containing the solvent composition. The article can be optionally subjected to ultrasonic agitation, or contacted with a jet stream of the solvent composition. In one aspect, the solvent composition is sprayed onto the article prior to degreasing, such as vapor degreasing.

Ultrasonics may be used in conjunction with the wet cleaning for removing at least one of water or water-soluble contaminants from, for example, deep recesses or inaccessible areas.

The wet cleaning may include contacting the surface of the article with an absorbent medium containing the composition. The absorbent medium may be, for example, a cloth, swab, paper, or brush saturated with the composition. The surface of the article may be wiped, rubbed, or brushed with the absorbent medium. For example, when the absorbent medium is a cloth, the article may be wiped with the cloth to wet clean the article.

The contacting temperature can vary widely depending on the boiling point of the composition, as well as the particular application. For example, the cleaning may be performed at room temperature, or may be performed at an elevated temperature, such as up to and including the boiling point of the composition. In one embodiment, the boiling point of the compositions disclosed herein may be, for example, in the range of about 35 to about 65° C., about 40 to about 60° C., or about 45 to about 55° C., at atmospheric pressure.

As mentioned above, the method of contacting may be accomplished by dipping or immersing the article in a bath of the cleaning composition. In one embodiment, the cleaning methods include immersing the article to be cleaned in the liquid solvent composition at an elevated temperature. For example, the article may be immersed in the liquid composition at about the boiling point of the cleaning composition. In one such embodiment, this step may remove a substantial amount of the target contaminant from the article, or remove a major portion of the target contaminant from the article. In one embodiment, this step is then followed by immersing the article in freshly distilled cleaning composition, which is at a temperature below the temperature of the liquid cleaning composition in the preceding immersion step. The freshly distilled cleaning composition may be at about ambient or room temperature.

For difficult to remove soils, where elevated temperature is necessary to improve the cleaning action of the solvent composition, or for large volume assembly line operations, where the cleaning of metal parts and assemblies must be done efficiently, a vapor degreaser may be employed. In its simplest form, vapor degreasing, involves exposing a room temperature article to be cleaned to the vapors of a boiling solvent composition. The vapors condensing on the article provide a clean distilled solvent to wash away grease or other contaminants. Final evaporation of the solvent from the article leaves substantially no residue on the article.

Azeotropic or azeotrope-like solvent compositions are particularly desirable in vapor degreasing applications because they do not fractionate upon boiling. This behavior is desirable because in vapor degreasing equipment, in which the solvent composition is employed, redistilled solvent is generated for a final rinse cleaning. Thus, the vapor degreasing system acts as a still. Unless the solvent composition exhibits a constant boiling point, i.e., is at least azeotrope-like, fractionation may occur and undesirable solvent distribution may upset the cleaning and safety of the process.

In some embodiments, the contacting may be performed via vapor degreasing. Vapor degreasing can be performed in an open or closed vapor degreasing apparatus. It is contemplated that numerous varieties and types of vapor degreasing equipment are adaptable for use in connection with the present methods. For example, the equipment may include a boiling sump for containing the cleaning composition, a clean sump for containing the distilled cleaning composition, a water separator, and any other ancillary equipment.

In some embodiments, vapor degreasing may be performed by heating or boiling the composition to vaporize the composition, and exposing the article to vapors of the composition. For example, the liquid solvent composition may be heated in a reservoir to vaporize the composition. The vapors of the composition can condense on the surface of the article during exposure of the article to the vapors. The surface of the article can be relatively cold compared to the relatively hot vapor. The condensed vapors can then solvate or entrain one or more contaminates on the surface of the article. The contaminated solvent (i.e., the condensed solvent containing the dissolved contaminants) can then be drained into the reservoir, for example, by falling from the article into the reservoir under the influence of gravity. The reservoir can be the same reservoir containing the liquid solvent composition that is being heated to vaporize the composition. The liquid solvent composition can be vaporized continuously to form a vapor blanket comprising the composition. Because only the solvent composition is vaporized (and not the contaminants), the contaminants remain in the reservoir, for example, in the form of a sludge. The article can therefore be continuously flushed with the non-contaminated solvent composition.

The contacting of the vapor with the article in some embodiments creates a scrubbing action as the vapor condenses on the article. The article can be maintained in contact with the vapor composition for a period of time to raise the temperature of the article to about the temperature of the vapor, whereupon condensation substantially ceases and the article appears dry. The article can then be removed from the degreaser. The time required to cause cessation of the condensation process varies depending upon numerous factors, including the particular solvent composition employed, the temperature of the vapor, the weight of the article, its specific heat, and the type of contamination material to be removed.

The vapor degreasing can be beneficially used in some embodiments to contact the surface of the article, as well as penetrate any holes, cracks, or crevices of the article, so as to remove contaminants therefrom.

Another type of vapor degreasing is referred to as vapor-spray cycle degreasing. In vapor-spray cycle degreasing, the article to be cleansed is first placed in a vapor zone, as is done in the above-described vapor degreasing process. A portion of the vapor is condensed by use of cooling coils and fills a liquid solvent reservoir. Warm liquid solvent is pumped through a spray nozzle which sprays it directly onto the part to be degreased, thus washing off contaminants and cooling the article.

In some embodiments, the vapor phase degreasing may be liquid-vapor cycle degreasing. In liquid-vapor cycle degreasing, a first compartment contains a refluxing solvent and a second compartment contains a somewhat cooler solvent condensate, which is referred to as the rinse sump. A vapor zone is maintained over the refluxing solvent. In this type of degreasing operation, the article to be cleaned is first suspended in the vapor zone until condensation of vapor on the article ceases. Next, the article is lowered into the refluxing solvent in the first compartment. After a suitable period of time, the article is removed to the rinse sump. Finally, the parts are again placed in the vapor zone until dry. This type of degreasing may be particularly useful for heavily soiled articles or for cleaning a basket or container of small parts that are nested together.

In some embodiments, the vapor phase degreasing is ultrasonic degreasing. Ultrasonic degreasing can be useful for cleaning critical parts and typically uses a transducer that is mounted at the base of a solvent tank and operates in the range of 20 to 40 kHz. The transducer alternately compresses and expands the solvent composition, thereby forming small bubbles that, in turn, cavitate or collapse on the surface of the article. This cavitation phenomenon disrupts the adhering contaminants, thereby cleaning the article.

Because vapor degreasing operations generally involve the use of a heat source in relatively close proximity to the degreasing solvents in both liquid and vapor states, it is highly beneficial to use a solvent composition that remains nonflammable through all parts of the degreasing process/apparatus in order to minimize or reduce the danger of fire or explosion. Similarly, it is highly recommended to use a nonflammable composition for cleaning electronic or electrical components or devices to minimize or reduce the danger of the component or device catching fire.

In most embodiments, the present compositions are nonflammable despite a significant amount of t-DCE, which is considered to be flammable. The methods of cleaning, particularly vapor degreasing of an article using the present composition is highly advantageous at least because it reduces the risk of fire or an explosion. Another advantage of the present methods of cleaning that use a nonflammable composition disclosed herein is that precautions against the hazard of flammability or explosion need not be taken. Further, there is no need to label storage tanks containing the composition with signs or warnings against those risks.

Azeotrope or azeotrope-like compositions are especially advantageous for use in a vapor degreasing process because both the distillate and residue do not have substantial changes in composition. Therefore, the composition is not shifted into a flammable range during vapor degreasing. Further, even after partial distillation, the composition of both the residue and of the distillate retains the composition's properties, for example, its ability to degrease, dewater, and solubilize contaminants.

After contact with the composition, the composition may be removed from the surface of the article by evaporation of the composition, draining the composition off the surface, or wiping or brushing the composition off the surface. For example, the solvent composition along with the dissolved contaminants may be removed from the surface of the article by wiping it away, such as with a cloth or other material, or by letting the solvent composition run off into a pan or other collection device. In some embodiments, the surface of the article is recovered from the composition by allowing the composition to evaporate, for example, due to the natural evaporation tendencies of the composition. The present composition can evaporate quickly. In some embodiments, the composition can evaporate at ambient or room temperature. Alternatively, the article may be heated to facilitate evaporation of the composition. For example, the article may be contacted with a jet stream of warm air to facilitate evaporation of the composition.

Use of the present composition is advantageous because substantially no residue from the composition itself remains on the surface after cleaning. Not only might residue interfere with the performance of the article, for example, an electrical or electronic component, but it could also damage the article. The present composition advantageously leaves substantially no residue, while simultaneously being strong enough to tackle tenacious contaminants. As a result of the methods of cleaning disclosed herein, one or more contaminants are removed from the article, for example, by being dissolved in the composition.

Other Methods of Using the Composition

Other non-limiting examples of uses for the present solvent compositions include their use as solvents in dewatering, refrigeration flushing, oxygen system cleaning, foam blowing, paints, adhesives, lubricants, drycleaning, and systems for depositing a material onto a substrate, for example to deposit silicone fluids on hypodermic needles, to deposit lubricating oils in very small and inaccessible places, to deposit paints and varnishes, and to deposit glues.

In one embodiment, a method for dewatering or drying a substrate includes a) contacting the substrate with the solvent composition disclosed herein, thereby dewatering the substrate, and b) recovering the dewatered substrate from the composition. In one embodiment, the dewatering or drying method of the present disclosure is very effective in displacing water from a broad range of substrates including, for example, metals, such as tungsten, copper, gold, beryllium, stainless steel, aluminum alloys, brass and the like; from glasses and ceramic surfaces, such as glass, borosilicate glass, alumina, silica such as silicon wafers used in electronic circuits, amorphous silica and alumina and the like; and from plastics.

Methods of contacting the substrate with the dewatering composition are not limited and can vary widely. For example, the substrate can be immersed in the composition, or the substrate can be sprayed with the composition using conventional equipment. Complete immersion of the substrate may be preferred as it generally ensures contact between the composition and all exposed surfaces of the substrate. However, any other method, which can easily provide complete or nearly complete contact may be used.

In one embodiment of the dewatering process, the contacting time is from about 1 second to about 5 minutes. In another embodiment, the contacting time of the dewatering process is from about 15 seconds to about 4 minutes. Contacting temperatures can also vary widely depending on the boiling point of the composition. In general, the contacting temperature is equal to or less than the composition's normal boiling point.

The methods of depositing a material onto a substrate may involve using the composition as a carrier solvent in applications including, for example, paints, lubricants, adhesives, penetrants, coatings, and surface protectants. For example, a material may be deposited on a substrate by dissolving the material in the present composition, applying the composition containing the material onto the substrate, and evaporating the composition such that the material remains on the substrate. Materials may include, for example, polymers, waxes, oils, silicone fluids, other lubricants, paints, pesticides, insecticides, and fungicides.

More specifically, the composition may be used for dissolving materials, and for removing these materials from, and/or delivering these materials to a surface. For example, after the composition dissolves one or more materials, these materials may be reconstituted on any number of surfaces for the purpose of providing a coating.

Solvent compositions are advantageous in systems where one or more materials are dissolved in the solvent composition and then deposited on a substrate upon evaporation of the solvent. Azeotrope or azeotrope-like composition is particularly desirable for use in such systems because the solubility parameters of the solvent composition remain relatively constant as the azeotrope or azeotrope-like composition evaporates.

A material or substance may be dissolved in the present composition. Then, this liquid is applied to a substrate by dipping, brushing, or spraying, including aerosol spraying. Next, the present composition is evaporated from the substrate by heating, or by the natural evaporation tendencies of the composition. The material or substance is then left behind on the substrate in an even, thorough coating.

In another embodiment, the solvent composition may be used to remove a coating from a substrate. In this method, the substrate is contacted with the solvent composition to dissolve the coating, and then the composition containing the dissolving coating is removed from the substrate. In one aspect, the coating may be paint and the composition may be used to strip paint from a substrate.

In another aspect, the solvent composition may be used in a drycleaning method including, for example, contacting a fabric or fiber with the solvent composition in a drycleaning machine to clean the fabric or fiber. Non-limiting examples of the fabric or fiber include a garment, bedding, furniture covering, rug, wall covering, drapery, napkin, or tablecloth. The fabric or fiber may be made of, for example, cotton, wool, silk, rayon, polyester, nylon, acetates, polyolefins, acrylics, spandex, and blends thereof. After contacting the fabric or fiber with the solvent composition, the fabric or fiber may be heated to remove any remaining solvent composition from the fabric or fiber. The drycleaning solvent composition may also include a detergent, anti-static agent, surfactant, fabric softener, brightener, disinfectant, anti-redeposition agent, fragrance, or a mixture thereof.

The solvent composition may be used in a blowing agent composition. The blowing agent may be used to prepare a foam. For example, a method may include providing a blowing agent composition, directly or indirectly adding the blowing agent composition to a foamable composition, and reacting the foamable composition under the conditions effective to form a foam or cellular structure, as is well known in the art. For example, a blowing agent including the solvent composition may be vaporized in the presence of a foamable composition to form a foam. Other materials, such as catalysts, surfactants, and optionally, flame retardants, colorants, or other additives may also be combined with the blowing agent and foamable composition.

Also, a process is provided for lubricating an object, such as metal, cermet, or composite. The process uses a working fluid comprising the disclosed solvent composition. The working fluid may further contain a lubricious additive. A lubricious additive is defined herein as an additive that modifies the coefficient of friction between a work piece and tooling. In some embodiments, a working fluid containing the solvent composition and a lubricious additive may be used for a tooling operation. Exemplary substrates in working operations include: metal, cermet, and composite work pieces. Typically, working fluids lubricate machining surfaces, resulting in a smooth and substantially residue-free machined work piece surface. In some embodiments, exemplary working fluids used in these operations also cool the machining environment, for example, the surface interface between a work piece and a machining tool, by, for example, removing heat and/or particulate matter therefrom.

In some embodiments, a working fluid is formulated so that the cutting and forming processes are lubricated to reduce friction, heat build-up in the tool or work piece, and/or prevent material transfer from the work piece to the tool. In some embodiments, a working fluid fully wets the working tooling. In some embodiments, the composition included in the working liquid evaporates from the working tool and work piece. In some embodiments, the lubricious additive is present as a thin film that reduces friction and heat build-up on the surfaces of the tool and work piece, and/or prevents material transfer from the work piece to the tooling. Generally, the lubricious additive is selected such that it is sufficiently high in boiling point to lubricate the working process without evaporating prematurely and still low enough in boiling point to fully evaporate from the working process so that little or no residue remains. Non-limiting examples of lubricious additives for working operations include esters of $C_8$ to $C_{14}$ fatty acids, alkylene glycol ethers, hydrocarbon distillates, and esters of lactic acid.

The solvent composition may also be used as a heat-transfer fluid in heat-transfer processes, where the heart-transfer fluid can transfer thermal energy (e.g., heat) either in a direct or indirect manner. For example, in direct heat transfer, the heat-transfer fluid conducts heat directly to and/or from a heat sink or source to a fluid by directly contacting the fluid with the heat sink or source. Exemplary direct heat transfer systems include the immersion cooling of electrical components and the cooling of an internal combustion engine.

Indirect heat transfer refers to a heat-transfer process in which a heat-transfer fluid conducts heat to and/or from a heat sink or source without directly contacting the fluid with the heat sink or source. Examples of indirect heat transfer include refrigeration, air conditioning, and/or heating (e.g., using heat pumps) processes, such as are used in buildings, vehicles, and stationary machinery. In some embodiments, a process for transferring heat is provided that includes employing the solvent composition as a secondary loop refrigerant or as a primary loop refrigerant. In these embodiments, the secondary loop refrigerant (i.e., a wide temperature range liquid fluid) provides a means for transferring heat between the heat source and the primary loop refrigerant (i.e., a low temperature-boiling fluid, which accepts heat by e.g., expanding to a gas and rejects heat by being condensed to a liquid, typically by using a compressor). Examples of equipment in which the provided compositions may be useful include centrifugal chillers, household refrigerator/freezers, automotive air conditioners, refrigerated transport vehicles, heat pumps, supermarket food coolers and display cases, and cold storage warehouses.

In indirect heat-transfer processes, lubricious additives for heat transfer can be incorporated in the heat-transfer fluid where moving parts (e.g., pumps and valves) are involved to ensure that the moving parts continue to work over long periods of time. Generally, these lubricious additives should possess good thermal and hydrolytic stability and should exhibit at least partial solubility in the heat-transfer fluid. Examples of suitable lubricious additives include mineral oils, fatty esters, highly halogenated oils, such as chlorotrifluoroethylene-containing polymers, and synthetic lubricious additives, such as alkylene oxide polymers. The solvent compositions can also function as a working fluid in an organic Rankin cycle, for example to recover energy from sources such as waste heat from industrial processes, geothermal heat, or solar heat.

The present compositions and methods offer several advantages over existing compositions and methods. The compositions and methods, as well as their advantages will be described in greater detail by way of specific examples. The following examples are offered for illustrative purposes and are not intended to limit or define the invention in any manner.

EXAMPLES

The preparation, identification, and testing of the compositions of this disclosure are further described in the following examples. The particular materials and amounts thereof used in these examples, as well as other conditions and details, should not be construed to unduly limit this invention. In these examples, all percentages, proportions, and ratios are by weight unless otherwise indicated.

All the chemical components which are disclosed here are commercially available through chemical distributors such as Aldrich Chemical Company, Inc. (Milwaukee, Wis.).

Example 1

Mixtures of TFE-TFPE (HFE-458) and t-DCE were distilled at ambient pressure. The distillate fractions were analyzed to identify whether these mixtures formed a binary azeotrope, and if so, the composition (% by weight) and boiling point (° C.) of the azeotrope, using the following procedure. The mixtures were prepared and distilled at ambient pressure in a glass filled distillation column (available from Ace Glass, Vinland, N.J.). The entire distillation apparatus (heat, temperature, reflux ratio) was continuously controlled and recorded by ShotoLab software (available from Shoto Technologies in Bayonne, N.J.). In each case, the distillation was allowed to equilibrate at total reflux for at least 30 minutes. For each distillation, six to eighteen successive distillate cuts were taken, each approximately 5-10 percent by volume of the total liquid charge, while operating the column at a liquid reflux ratio of 10:1. In some of the tests, the distillation was carried until all the liquid totally evaporated.

The temperatures were measured at four locations in the system (liquid in the flask, vapors above the liquid in the flask, vapors at the top of the distillation column, and the vapors near the condenser) and recorded continuously. The compositions of the distillate cuts were then analyzed using an AGILENT 6890 Gas Chromatograph. The presence of an azeotrope was confirmed by a distillate vapor temperature below the boiling point of the two individual components and a surprisingly constant distillate composition throughout 80% of the distillation. For each distillation, the average composition and temperature of all distillate fractions were recorded and measured. This procedure was repeated several times for each mixture. Using this procedure, the following azeotropes listed in Table 1 and FIG. 1 were identified. The reported composition and boiling point for each azeotrope are provided in Table 1 below.

TABLE 1

| Cut # | Accumulated Distillation % | Liquid Boiling Point ° C. | Col. Top Temp ° C. | t-DCE, wt. % | TFE-TFPE, wt. % |
|---|---|---|---|---|---|
| 01 | 5.35 | 47.7 | 47.6 | 96.36 | 3.65 |
| 02 | 11.48 | 47.8 | 47.7 | 96.31 | 3.69 |
| 03 | 17.19 | 47.8 | 47.7 | 96.23 | 3.77 |
| 04 | 23.06 | 47.8 | 47.7 | 96.17 | 3.83 |
| 05 | 28.87 | 48.0 | 47.7 | 96.12 | 3.86 |
| 06 | 34.74 | 48.0 | 47.7 | 96.00 | 3.95 |
| 07 | 40.86 | 48.0 | 47.8 | 95.92 | 4.07 |
| 08 | 46.73 | 47.9 | 47.7 | 95.90 | 4.09 |
| 09 | 52.91 | 48.0 | 47.8 | 95.92 | 4.07 |
| 10 | 60.27 | 48.0 | 47.8 | 95.76 | 4.24 |
| 11 | 66.55 | 48.0 | 47.8 | 95.71 | 4.29 |
| 12 | 73.03 | 48.0 | 47.9 | 95.46 | 4.54 |
| 13 | 79.88 | 48.0 | 47.9 | 95.20 | 4.79 |

TABLE 1-continued

| Cut # | Accumulated Distillation % | Liquid Boiling Point ° C. | Col. Top Temp ° C. | t-DCE, wt. % | TFE-TFPE, wt. % |
|---|---|---|---|---|---|
| 14 | 86.05 | 48.2 | 47.9 | 94.83 | 5.16 |
| 15 | 91.56 | 48.3 | 48.1 | 94.42 | 5.57 |
| 16 | 97.48 | 48.9 | 48.1 | 93.83 | 6.17 |
| 17 | 100.00 | 51.9 | 48.1 | 92.36 | 7.63 |

Throughout the distillation, especially between the cuts at 5% (cut #02) and 70% (cut #12), the distillation temperatures and compositions remained remarkably constant, and the distillation column-top temperatures were practically identical to the boiling liquid temperatures. Together, this indicates the presence of an azeotrope. On average, the composition of 4.0±0.3 weight % TFE-TFPE and 96.0±0.3 weight % t-DCE was observed. Closed cup flash point tests indicate that that the composition of 4% TFE-TFPE and the balance t-DCE has no flash point.

Compositions having a boiling temperature of less than the boiling point of each pure component were considered evidence of at least azeotrope-like behavior. For the TFE-TFPE and t-DCE mixtures, this azeotrope-like range was found to be from about 0.5 wt. % TFE-TFPE to about 8.3 wt. % TFE-TFPE.

Example 2

Figure 2:
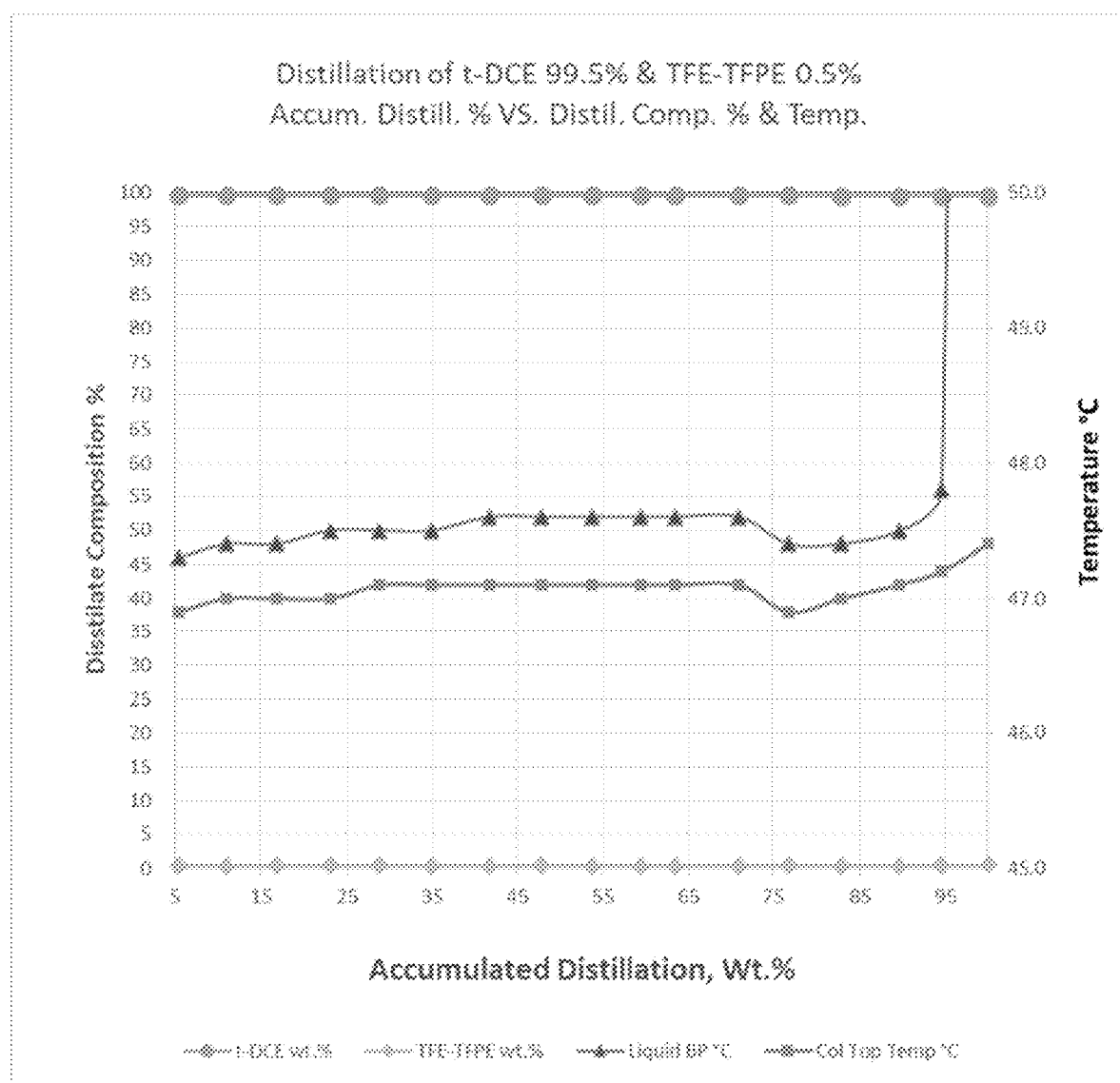
FIG. 2 is a line chart showing the average composition and temperature of successive distillate fractions of a composition of about 99.51±0.02 wt. % t-DCE and 0.49±0.01 wt. % TFE-TFPE.

The process of Example 1 was repeated with a different ratio of TFE-TFPE and t-DCE. The cuts were taken until the flask was dry. The results are shown in Table 2 and FIG. 2.

TABLE 2

| Cut # | Accumulated. Distillation % | Liquid Boiling Point ° C. | Col Top Temp ° C. | t-DCE wt. % | TFE-TFPE wt. % |
|---|---|---|---|---|---|
| 01 | 5.4 | 47.3 | 46.9 | 99.52 | 0.48 |
| 02 | 11 | 47.4 | 47.0 | 99.52 | 0.48 |
| 03 | 16.8 | 47.4 | 47.0 | 99.52 | 0.48 |
| 04 | 23.1 | 47.5 | 47.0 | 99.52 | 0.48 |
| 05 | 28.9 | 47.5 | 47.1 | 99.52 | 0.48 |
| 06 | 34.9 | 47.5 | 47.1 | 99.52 | 0.48 |
| 07 | 41.8 | 47.6 | 47.1 | 99.52 | 0.48 |
| 08 | 47.9 | 47.6 | 47.1 | 99.52 | 0.48 |
| 09 | 53.7 | 47.6 | 47.1 | 99.50 | 0.50 |
| 10 | 59.5 | 47.6 | 47.1 | 99.50 | 0.50 |
| 11 | 63.4 | 47.6 | 47.1 | 99.50 | 0.50 |
| 12 | 70.9 | 47.6 | 47.1 | 99.50 | 0.50 |
| 13 | 76.8 | 47.5 | 47.0 | 99.50 | 0.50 |
| 14 | 82.9 | 47.5 | 47.0 | 99.49 | 0.51 |
| 15 | 89.6 | 47.5 | 47.1 | 99.49 | 0.51 |
| 16 | 94.6 | 47.8 | 47.2 | 99.49 | 0.51 |
| 17 | 100 | 74.9 | 47.4 | 99.47 | 0.53 |

Throughout the distillation, especially between the cuts at 5% and 80%, (cuts #01-14) the distillation temperatures and compositions remained remarkably constant, which indicates azeotropic behavior. On average the composition of 0.49±0.01 weight % TFE-TFPE and 99.51±0.02 weight % t-DCE was observed.

Example 3

Figure 3:
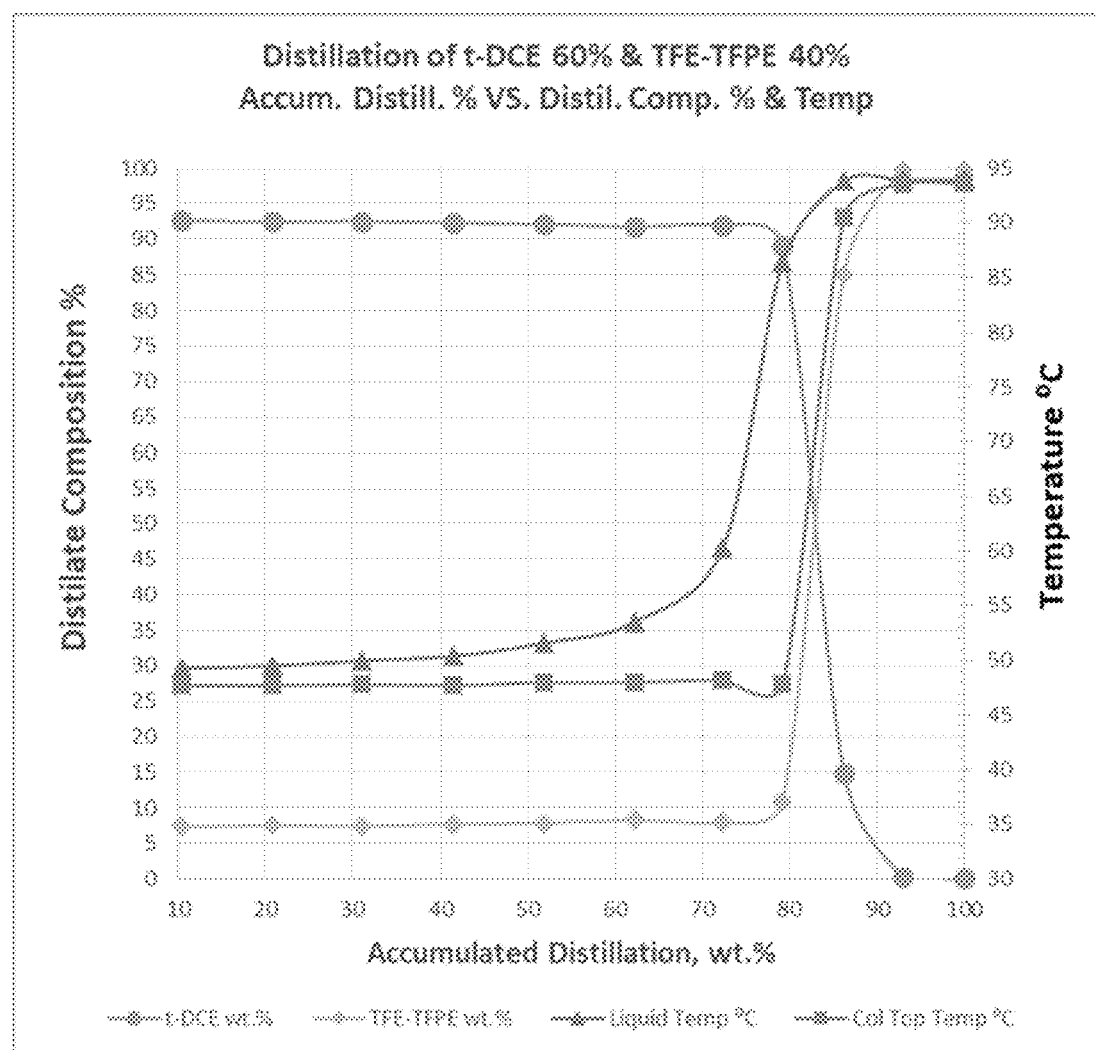
FIG. 3 is a line chart showing the average composition and temperature of successive distillate fractions of a composition of about 92.25±0.3 wt. % t-DCE and 7.75±0.3 wt. % TFE-TFPE.

The same distillation procedure as in Example 1 was performed except that a different ratio of TFE-TFPE and t-DCE was used. The cuts were taken until the flask was dry. The results are shown in Table 3 and FIG. 3.

TABLE 3

| Cut # | Accumulated Distillation % | Liquid Boiling Point ° C. | Col Top Temp ° C. | t-DCE wt. % | TFE-TFPE wt. % |
|---|---|---|---|---|---|
| 01 | 10.4 | 49.3 | 47.7 | 92.61 | 7.39 |
| 02 | 20.8 | 49.5 | 47.7 | 92.43 | 7.57 |
| 03 | 31.1 | 50.0 | 47.8 | 92.52 | 7.48 |
| 04 | 41.5 | 50.4 | 47.7 | 92.27 | 7.73 |
| 05 | 51.9 | 51.6 | 48.0 | 92.08 | 7.92 |
| 06 | 62.3 | 53.5 | 48.0 | 92.01 | 7.99 |
| 07 | 72.3 | 60.2 | 48.2 | 91.93 | 8.07 |
| 08 | 79.2 | 86.3 | 47.8 | 89.11 | 10.89 |
| 09 | 86.2 | 93.8 | 90.4 | 14.86 | 85.14 |
| 10 | 93 | 93.9 | 93.5 | 0.34 | 99.66 |
| 11 | 100 | 93.9 | 93.6 | 0.09 | 99.91 |

It can be observed that throughout the distillation, especially until 60% accumulated distillation, the distillation temperatures and compositions remained relatively constant which indicates azeotropic behavior. On average the composition of 7.75±0.3 weight % TFE-TFPE and 92.25±0.3 weight % t-DCE was observed. Closed cup flash point tests indicate that that this composition has no flash point. However, at the current distillate composition of about 9 wt. % TFEPE, there is a clear break from azeotropic behavior.

Compositions which have a boiling temperature of less than the boiling point of each pure component were considered evidence of azeotrope-like behavior. For the TFE-TFPE and t-DCE mixtures, this azeotrope-like range was found to be about 0.5 wt. % TFE-TFPE to about 8.3 wt. % TFE-TFPE.

Example 4

Figure 4:
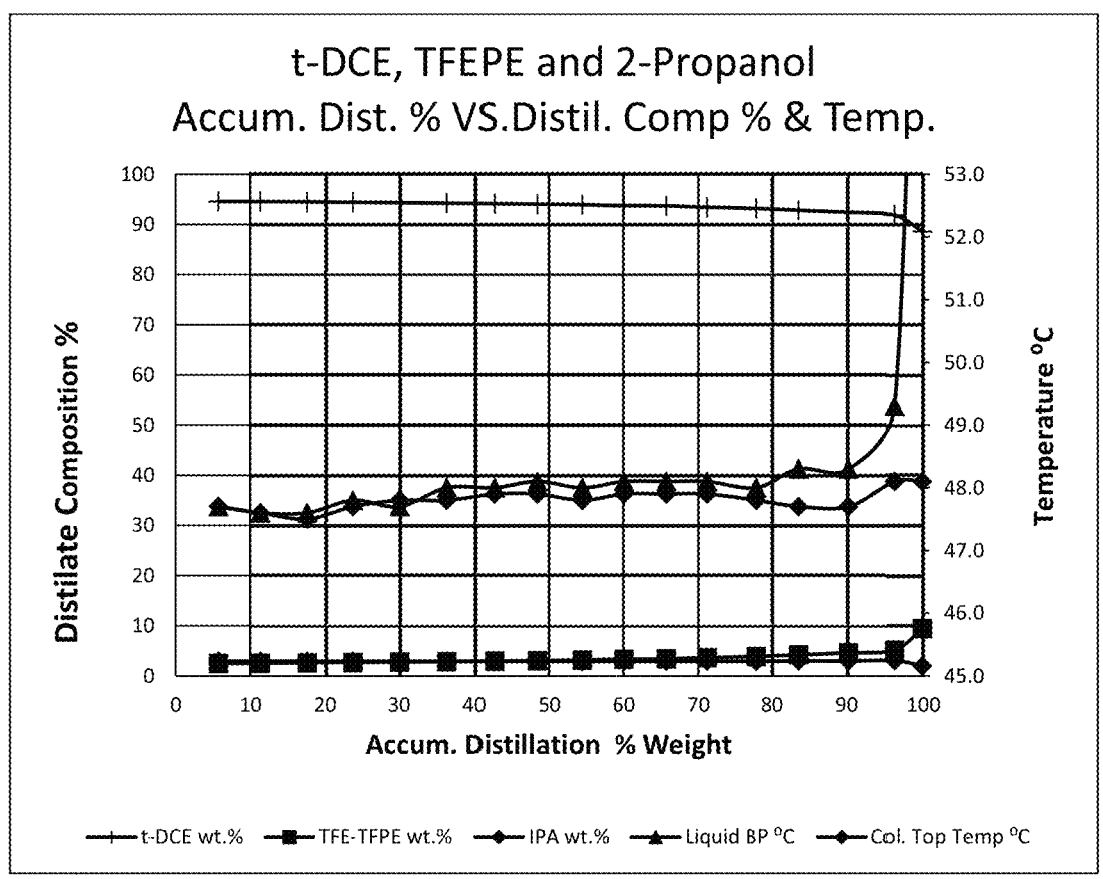
FIG. 4 is a line chart showing the average composition and temperature of successive distillate fractions of a composition of about 94.06±0.69 wt. % t-DCE, 3.0±0.6 wt. % TFE-TFPE, and 2.91±0.01 wt. % isopropanol.

Mixtures of TFE-TFPE, t-DCE, and isopropanol were distilled at ambient pressure. The distillate fractions were analyzed to identify whether these mixtures formed a ternary azeotrope, and if so, the composition (% by weight) and boiling point (° C.) of the azeotrope, using the procedure described above for Example 1. The results of the fractional distillation, which was carried out all the way, of the ternary azeotrope-like system based on t-DCE, TFE-TFPE, and isopropanol are described in Table 4 and FIG. 4.

TABLE 4

| Acc. Dist. % | Liquid Boiling Point ° C. | Col. Top Temp ° C. | t-DCE wt. % | TFE-TFPE wt. % | IPA wt. % |
|---|---|---|---|---|---|
| 5.72 | 47.7 | 47.7 | 94.58 | 2.49 | 2.93 |
| 11.33 | 47.6 | 47.6 | 94.56 | 2.52 | 2.92 |
| 17.60 | 47.6 | 47.5 | 94.47 | 2.63 | 2.91 |
| 23.74 | 47.8 | 47.7 | 94.42 | 2.69 | 2.89 |
| 29.96 | 47.7 | 47.8 | 94.33 | 2.76 | 2.91 |
| 36.29 | 48.0 | 47.8 | 94.24 | 2.86 | 2.91 |
| 42.73 | 48.0 | 47.9 | 94.15 | 2.94 | 2.92 |
| 48.44 | 48.1 | 47.9 | 94.05 | 3.04 | 2.91 |
| 54.47 | 48.0 | 47.8 | 93.94 | 3.17 | 2.89 |
| 60.03 | 48.1 | 47.9 | 93.74 | 3.34 | 2.92 |
| 65.70 | 48.1 | 47.9 | 93.71 | 3.39 | 2.91 |
| 71.16 | 48.1 | 47.9 | 93.41 | 3.65 | 2.94 |
| 77.74 | 48.0 | 47.8 | 93.20 | 3.88 | 2.92 |
| 83.41 | 48.3 | 47.7 | 92.82 | 4.21 | 2.97 |

TABLE 4-continued

| Acc. Dist. % | Liquid Boiling Point ° C. | Col. Top Temp ° C. | t-DCE wt. % | TFE-TFPE wt. % | IPA wt. % |
|---|---|---|---|---|---|
| 90.10 | 48.3 | 47.7 | 92.42 | 4.59 | 2.97 |
| 96.27 | 49.3 | 48.1 | 91.84 | 5.12 | 3.04 |
| 100.00 | 61.3 | 48.1 | 88.58 | 9.46 | 1.96 |

Throughout the distillation, especially between the cuts at 5% and 80%, the distillation column-top temperatures and compositions remained remarkably constant, and the distillation column-top temperatures were practically identical to the boiling liquid temperatures. Together, this indicates the presence of an azeotrope. On average the composition of 3.0±0.6 wt. % TFE-TFPE, 94.06±0.69 wt. % t-DCE, and 2.91±0.01 wt. % isopropanol was observed, all at a constant distillate temperature of about 47.8° C.

Compositions which have a boiling temperature of less than the boiling point of each pure component were considered evidence of azeotrope-like behavior. For the TFE-TFPE, t-DCE, and isopropanol mixtures, this azeotrope-like range was found to be from about 0.5 wt. % to about 5.5 wt. % TFE-TFPE and from about 2.0 wt. % to about 4.0 wt. % isopropanol.

Example 5

Figure 5:
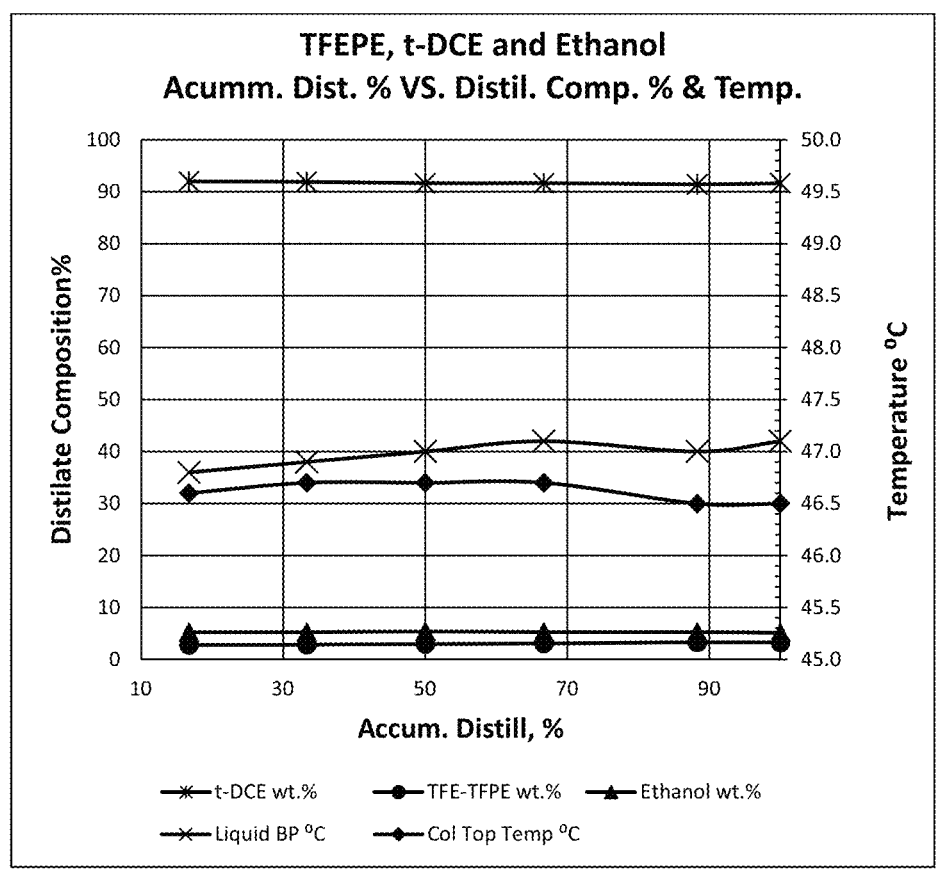
FIG. 5 is a line chart showing the average composition and temperature of successive distillate fractions of a composition of about 91.71±0.28 wt. % t-DCE, 3.03±0.22 wt. % TFE-TFPE, and 5.25±0.12 wt. % ethanol.

The process of Example 4 was repeated except that ethanol was used instead of isopropanol. The results of the fractional distillation, which was carried out all the way, of the ternary azeotrope-like system based on t-DCE, TFE-TFPE, and ethanol are described in Table 5 and FIG. 5.

TABLE 5

| Acc. Distill. wt. % | Liquid Boiling Point ° C. | Col. Top Temp ° C. | t-DCE wt. % | TFE-TFPE wt. % | Ethanol wt. % |
|---|---|---|---|---|---|
| 16.7 | 46.8 | 46.6 | 91.99 | 2.78 | 5.23 |
| 33.3 | 46.9 | 46.7 | 91.91 | 2.83 | 5.25 |
| 50.0 | 47.0 | 46.7 | 91.64 | 2.98 | 5.38 |
| 66.7 | 47.1 | 46.7 | 91.65 | 3.08 | 5.27 |
| 88.3 | 47.0 | 46.5 | 91.42 | 3.31 | 5.27 |
| 100.0 | 47.1 | 46.5 | 91.63 | 3.25 | 5.12 |

Throughout the distillation, especially between the cuts at 5% and 80%, the distillation temperatures and compositions remained remarkably constant, which indicates azeotropic behavior. On average, the composition of 3.03±0.22 weight % TFE-TFPE, 5.25±0.12 wt. % ethanol, and 91.71±0.28 weight % t-DCE was observed.

Examples 6-12

Mixtures of TFE-TFPE and t-DCE alone or with one of methanol, ethanol, 1-propanol, 2-propanol, 2-butanol, or t-butanol were distilled at ambient pressure. The distillate fractions were analyzed to identify whether these mixtures formed an azeotrope, and if so, the composition (% by weight) and boiling point (° C.) of the azeotrope, using the same procedures as described above. This procedure was repeated several times for each mixture. Using this procedure, the following azeotrope-like compositions listed in Table 6 were identified.

TABLE 6

| Example | Liquid BP ° C. | Col. Top Temp. ° C. | t-DCE wt. % | TFE-TFPE wt. % | 3rd Component | wt. % |
|---|---|---|---|---|---|---|
| 6 | 47.9 | 47.7 | 96.0 | 4.0 | **** | **** |
| 7 | 42.4 | 42.1 | 88.8 | 1.9 | Methanol | 9.3 |
| 8 | 47.6 | 45.7 | 91.8 | 3.0 | Ethanol | 5.4 |
| 9 | 48.6 | 47.6 | 96.6 | 2.9 | n Propanol | 0.5 |
| 10 | 48.0 | 47.9 | 94.2 | 2.9 | Iso Propanol | 2.9 |
| 11 | 48.2 | 47.9 | 96.9 | 2.5 | 2 Butanol | 0.6 |
| 12 | 48.3 | 47.8 | 96.1 | 2.6 | t Butanol | 1.3 |

Examples 13 and 14

Mixtures of TFE-TFPE, t-DCE, and a fluorinated ether were distilled at ambient pressure. The fluorinated ether was HFE-7300 in Example 13, and MPHE in Example 14. The distillate fractions were analyzed to identify whether these mixtures formed a ternary azeotrope, and if so, the composition (% by weight) and boiling point (BP ° C.) of the azeotrope, using the same procedures as described above. This procedure was repeated several times for each mixture. Using this procedure, the following azeotrope-like compositions listed in Table 7 were identified.

TABLE 7

| Example | Liquid BP ° C. | Col. Top Temp. ° C. | t-DCE wt. % | TFE-TFPE wt. % | 3rd Component | wt. % |
|---|---|---|---|---|---|---|
| 13 | 47.1 | 46.8 | 79.5 | 1.5 | HFE-7300 | 19.0 |
| 14 | 47.9 | 47.6 | 94.0 | 2.8 | MPHE | 3.2 |

Example 15

Mixtures of TFE-TFPE, t-DCE, HFE-7300, and MPHE were distilled at ambient pressure. The distillate fractions were analyzed to identify whether this mixture formed a quaternary azeotrope, and if so, the composition (% by weight) and boiling point (° C.) of the azeotrope, using the same procedures as described above. This procedure was repeated several times for each mixture. Using this procedure, the following azeotrope-like composition shown in Table 8 was identified.

TABLE 8

| Example | Liquid BP ° C. | Col. Top Temp. ° C. | t-DCE wt. % | TFE-TFPE wt. % | 3rd Component | wt. % | 4th Component | wt. % |
|---|---|---|---|---|---|---|---|---|
| 15 | 48.0 | 47.2 | 83.3 | 1.4 | HFE-7300 | 14.3 | MPHE | 1.0 |

Example 16

A circuit board having dimensions of 3"×4" was coated with S3X48-M270 lead-free solder paste (available from KOKI Company). The solder paste was reflowed at 236° C. for 4 minutes in a convection oven. The board was then cooled to room temperature. The soldered test board was then immersed for 2 minutes into a boiling mixture containing the azeotrope of Example 4 (TFE-TFPE, t-DCE, and isopropanol). Upon removal from the mixture, visual inspection of the board indicated that the all of the solder flux residue had been removed, demonstrating the exceptional solvency power of the disclosed compositions.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. A solvent composition comprising:
   trans-1,2-dichloroethylene (t-DCE) in an amount in a range of from 85 to 99.5 wt. %; and 1,1,2,2-tetrafluoroethyl-2,2,3,3-tetrafluoropropyl ether (TFE-TFPE) in an amount in a range of from 0.1 to 15 wt. %,
   wherein the t-DCE and TFE-TFPE are present in amounts sufficient to form a binary azeotrope or azeotrope-like composition.

2. The solvent composition according to claim 1, wherein the composition is nonflammable.

3. A solvent composition comprising:
   65 to 98 wt. % of trans-1,2-dichloroethylene (t-DCE);
   0.1 to 30 wt. % of 1,1,2,2-tetrafluoroethyl-2,2,3,3-tetrafluoropropyl ether (TFE-TFPE); and
   0.1 to 15 wt. % of an oxygenated solvent selected from the group consisting of at least one of methanol, ethanol, isopropanol, t-butanol, 1-propanol, 2-butanol, methylperfluoroheptene ether (MPHE), and 3-methoxyperfluoro(2-methylpentane), wherein the t-DCE, TFE-TFPE, and the oxygenated solvent are present in amounts sufficient to form a ternary azeotrope or azeotrope-like composition.

4. The solvent composition according to claim 3, further comprising a fluorocarbon in an amount in a range of from about 0.01 to about 5 wt. %.

5. The solvent composition according to claim 3, wherein the composition is nonflammable.

6. A method of cleaning a surface of an article comprising:
   contacting the surface with the solvent composition according to claim 3 to dissolve, disperse, or displace a contaminant on the surface; and
   removing the solvent composition containing the contaminant from the surface.

7. The method according to claim 6, wherein the surface is contacted with the solvent composition via vapor degreasing, which is performed by:
   heating the solvent composition to vaporize the composition; and
   exposing the surface to vapors of the composition,
   wherein the vapors of the composition condense on the surface during exposure of the surface to the vapors to dissolve a contaminant on the surface.

8. A method of drycleaning a fabric, comprising contacting the fabric with the solvent composition according to claim 3 via a dry-cleaning machine to clean the fabric.

9. A method for depositing a coating material on a substrate, comprising:
   applying a coating mixture comprising a coating material and the solvent composition according to claim 3 to at least a portion of the substrate; and
   evaporating the solvent composition from the substrate.

10. A heat-transfer method comprising:
    directly or indirectly contacting a heat-transfer fluid comprising the solvent composition according to claim 3 with a heat sink or source to conduct heat directly or indirectly to or from the heat sink or source.

11. The solvent composition according to claim 3, wherein the oxygenated solvent is methylperfluoroheptene ether (MPHE).

12. A method of cleaning a surface of an article comprising:
    contacting the surface with the solvent composition according to claim 1 to dissolve, disperse, or displace a contaminant on the surface; and
    removing the solvent composition containing the contaminant from the surface.

13. The method according to claim 12, wherein the surface is contacted with the solvent composition via vapor degreasing, which is performed by:
    heating the solvent composition to vaporize the composition; and
    exposing the surface to vapors of the composition,
    wherein the vapors of the composition condense on the surface during exposure of the surface to the vapors to dissolve a contaminant on the surface.

14. The method according to claim 12, wherein the solvent composition is sprayed onto the surface in the form of a liquid or an aerosol.

15. A method of drycleaning a fabric, comprising contacting the fabric with the solvent composition according to claim 1 via a dry-cleaning machine to clean the fabric.

16. A method for depositing a coating material on a substrate, comprising:
    applying a coating mixture comprising a coating material and the solvent composition according to claim 1 to at least a portion of the substrate; and
    evaporating the solvent composition from the substrate.

17. A method for lubricating an object, comprising contacting the object with a working fluid comprising the solvent composition according to claim 1 to lubricate the object.

18. A heat-transfer method comprising:
    directly or indirectly contacting a heat-transfer fluid comprising the solvent composition according to claim 1 with a heat sink or source to conduct heat directly or indirectly to or from the heat sink or source.

19. A solvent composition comprising:
    65 to 98 wt. % of trans-1,2-dichloroethylene (t-DCE);
    0.1 to 30 wt. % of 1,1,2,2-tetrafluoroethyl-2,2,3,3-tetrafluoropropyl ether (TFE-TFPE); and
    0.1 to 15 wt. % of methylperfluoroheptene ether (MPHE) and 3-methoxyperfluoro(2-methylpentane),
    wherein: the t-DCE, TFE-TFPE, MPHE, and 3-methoxyperfluoro(2-methylpentane) are present in the composition in relative azeotrope or azeotrope-like amounts.

\* \* \* \* \*